(12) United States Patent
Boutami et al.

(10) Patent No.: US 9,401,377 B2
(45) Date of Patent: Jul. 26, 2016

(54) INFRARED DETECTOR MADE UP OF SUSPENDED BOLOMETRIC MICRO-PLATES

(71) Applicant: COMMISSARIAT A L'ENERGIE ATOMIQUE ET AUX ENERGIES ALTERNATIVES, Paris (FR)

(72) Inventors: Salim Boutami, Grenoble (FR); Geoffroy Dumont, Paris (FR); Jérome Hazart, Eybens (FR); Jean-Jacques Yon, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 164 days.

(21) Appl. No.: 14/354,750

(22) PCT Filed: Nov. 23, 2012

(86) PCT No.: PCT/FR2012/052708
§ 371 (c)(1),
(2) Date: Apr. 28, 2014

(87) PCT Pub. No.: WO2013/079855
PCT Pub. Date: Jun. 6, 2013

(65) Prior Publication Data
US 2014/0264712 A1    Sep. 18, 2014

(30) Foreign Application Priority Data
Nov. 29, 2011 (FR) ..................................... 11 60895

(51) Int. Cl.
| | |
|---|---|
| *H01L 27/144* | (2006.01) |
| *H01L 31/09* | (2006.01) |
| *H01L 31/18* | (2006.01) |
| *G01J 5/20* | (2006.01) |
| *G01J 5/08* | (2006.01) |
| *G02B 5/18* | (2006.01) |
| *G01J 5/02* | (2006.01) |
| *H01L 31/08* | (2006.01) |

(52) U.S. Cl.
CPC .............. *H01L 27/1446* (2013.01); *G01J 5/02* (2013.01); *G01J 5/024* (2013.01); *G01J 5/08* (2013.01); *G01J 5/0806* (2013.01); *G01J 5/20* (2013.01); *H01L 31/08* (2013.01); *H01L 31/18* (2013.01)

(58) Field of Classification Search
CPC ........ G01J 5/024; G01J 5/08; H01L 27/1446; H01L 31/09; H01L 31/18
USPC .............................. 257/436, 459, 466; 438/57
See application file for complete search history.

(56) References Cited

U.S. PATENT DOCUMENTS

| | | | |
|---|---|---|---|
| 6,094,127 | A | 7/2000 | Yong |
| 6,753,526 | B2 | 6/2004 | Vilain |

(Continued)

FOREIGN PATENT DOCUMENTS

| | | |
|---|---|---|
| EP | 0902484 A2 | 3/1999 |
| EP | 1116942 A1 | 7/2001 |

(Continued)

OTHER PUBLICATIONS

International Search Report Application No. PCT/FR2012/052708 Completed: Jan. 18, 2013; Mailing Date: Jan. 28, 2013 3 pages.

*Primary Examiner* — Marcos D Pizarro
(74) *Attorney, Agent, or Firm* — St. Onge Steward Johnston & Reens, LLC

(57) ABSTRACT

An array bolometric detector for detecting an electromagnetic radiation in a predetermined infrared or terahertz wavelength range, including a substrate, and an array of bolometric microplates for the detection of the radiation, suspended above the substrate by support elements. The detector includes a membrane arranged above each microplate, and having patterns having a refractive index smaller than that of the membrane formed therein. The patterns are placed periodically along at least one axis of the membrane, according to a period shorter than or equal to $$\frac{\lambda}{n},$$

where λ is a wavelength to be detected and n is the average refractive index of the medium separating the microplate from the membrane. The width of the patterns along the axis increases from a central location of the membrane towards the periphery thereof.

20 Claims, 14 Drawing Sheets

(56) References Cited

U.S. PATENT DOCUMENTS

| | | | |
|---|---|---|---|
| 6,924,485 B2 | 8/2005 | Kanzaki | |
| 2002/0175284 A1 * | 11/2002 | Vilain | B81B 7/0038 250/338.1 |
| 2004/0053435 A1 * | 3/2004 | Ikushima | B81B 3/0072 438/57 |

FOREIGN PATENT DOCUMENTS

| | | | |
|---|---|---|---|
| EP | 1243903 A2 | 9/2002 | |
| FR | 2752299 A1 | 2/1998 | |
| WO | 2011106553 A2 | 9/2011 | |
| WO | WO 2011106553 A2 * | 9/2011 | B82Y 20/00 |

* cited by examiner

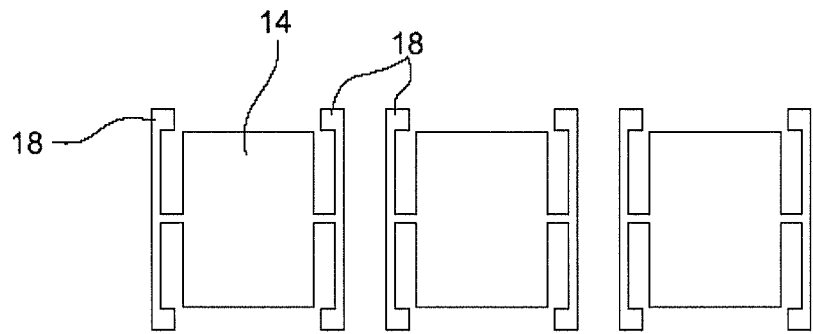
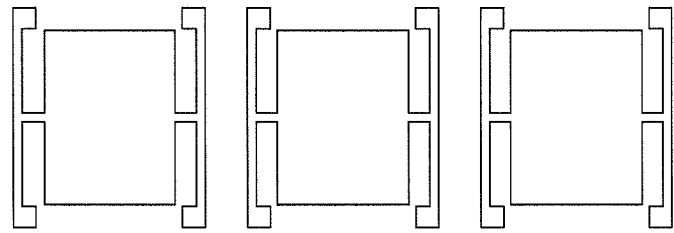
Fig. 23
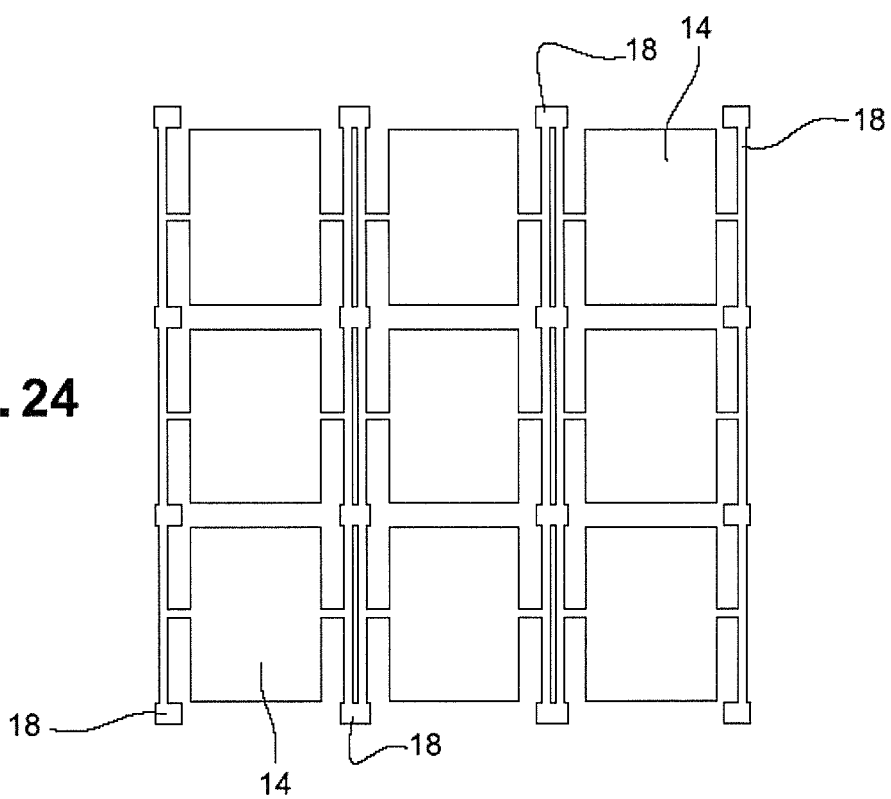
Fig. 24

INFRARED DETECTOR MADE UP OF SUSPENDED BOLOMETRIC MICRO-PLATES

FIELD OF THE INVENTION

The invention relates to infrared or terahertz bolometric detection, and more particularly to bolometric detection by means of an array of microplates suspended above a substrate.

BACKGROUND

As commonly admitted, infrared detection, in a broad sense, that is, in a wavelength range from 0.75 micrometers to 1,000 micrometers, is a technological field submitted to specific issues. Indeed, any object emits in the infrared spectrum as soon as its temperature is greater than 0° K. Thus, when the environment of an infrared detector is not cooled down, the members surrounding the sensitive elements (substrates, connectors, packages, optical systems, etc.) emit a significant infrared radiation which adds to the radiation from the scene which is desired to be detected. Such a non-useful component may be very significant and sometimes form a signal greater than that which is desired to be measured. A dark signal, which for example results from the thermal generation of carriers in the case of an IR photodiode, or from Ohm's law in the case of a bolometer, adds thereto. Such a non-useful component is commonly called "thermal noise" or "common-mode".

Accordingly, and unlike other types of detection, and particularly visible detection, it is necessary to provide structures and operations capable of efficiently managing this common mode. For this purpose, the first highly-sensitive infrared detectors used to be cooled down to very low temperatures, in the order of some hundred degrees Kelvin, or even of a few degrees Kelvin, to minimize the common mode.

There further exist two different classes of infrared detectors, that is, so-called "quantum" detectors and so-called "thermal" detectors, and particularly, for this last category, bolometric thermal detectors. As is also well known, the physical principles implemented by these two types of detection are fundamentally different and induce their own issues.

In the case of quantum detectors, a semiconductor is used to generate electron-hole pairs under the effect of photon absorption in the infrared spectrum, the charge carriers thus created being collected via electrodes, most often combined with a PN junction.

On the contrary, in the case of bolometric thermal detectors, an absorbing material selected for its ability to convert the power of the incident infrared flow into heat is used. This material, or a second material in contact with the first material, is also used to convert the generated heat into a variation of an electric characteristic, generally an electric resistance variation. The variation of the electric characteristic is then measured.

To improve the detector sensitivity, a specific bolometric detector architecture has been designed, that is, a detector which comprises an array of bolometric microplates suspended above a so-called "read" substrate by means of support and thermal insulation elements.

As known per se, such an architecture is specifically provided to thermally insulate the bolometric elements from the substrate. Thereby, a significant gain in sensitivity is obtained and, on the other hand, this architecture also enables to do away with the implementation of a cooling down to a very low temperature.

Although an architecture using suspended microplates has many advantages, and particularly the possibility of being used with no cooling down to very low temperatures, the presence of the bolometric microplate support elements does not provide a satisfactory filling rate by means of current manufacturing techniques, the filling rate being all the poorer as the microplate manufacturing is high.

Solutions have been developed to increase the filling rate. However, the latter imply making manufacturing methods more complex, which results in higher costs.

For example, document U.S. Pat. No. 6,094,127 describes a detector having three stacked stages with, in particular, a stage comprising an integrated circuit, a support stage, and an absorption stage. The absorption stage may thus occupy the entire surface of the detector, thus improving the efficiency. However, to electrically connect the absorption stage to the support stage, an electric interconnect element is interposed between the support and absorption stages. The electric interconnect element is formed of a conductive channel encased in a dielectric sheath. This results in a complex manufacturing process directly putting at stake the electric continuity from one stage to the other of the detector, which continuity is however a crucial element for the optimal operation of the detector. Further, the presence of the electric interconnect element in contact with the absorption stage may deteriorate the absorption quality and the detector sensitivity.

Further, to increase the production volume and/or to decrease manufacturing costs, collective manufacturing methods are usually implemented, several arrays of microplates being jointly manufactured on a same silicon wafer and then individualized, as for example described in documents U.S. Pat. No. 6,753,526 and U.S. Pat. No. 6,924,485.

Given that collective manufacturing methods are already used to manufacture arrays of microplates, collective manufacturing methods originating from microelectronics are also used to form detectors directly integrating a vacuum packaging for each microplate, as for example described in the last two above-mentioned documents. Such a packaging, commonly called "integrated tight micro-packaging", is formed of a capsule formed above each microplate and bearing on the substrate on either side thereof and tightly vacuum-sealed. The collective carrying out of the packaging steps thus enables to decrease detector production times and costs as compared with a single tight package individually formed for each microplate array.

However, the space necessary between microplates for the capsule bearing translates, for an equal array size, as a significant decrease of the optically-active surface of the detector, and thus as a direct decrease in the detector efficiency.

Thus, by construction, the useful surface area of a bolometric microplate suspended by support elements, dedicated to the detection of an infrared or terahertz radiation is limited with respect to the substrate surface area, which decreases the detector sensitivity.

For example, the forming of detectors with square microplates having a 12-micrometer side length, which dimensions currently form the maximum degree of miniaturization of bolometric microplates, and absorbing around λ=10 μm, requires for each microplate a square substrate surface area having a side length of at least 17 micrometers. The useful surface area of an array of microplates having a 12-micrometer side length, dedicated to the detection, thus amounts to at most 50% of the total surface area of the array.

BRIEF DESCRIPTION OF THE INVENTION

The present invention aims at solving the above-mentioned issue of decreased sensitivity due to a decreased useful surface area in bolometric detectors using suspended microplates.

For this purpose, the invention aims at an array bolometric detector for the detection of an electromagnetic radiation in a predetermined range of infrared or terahertz wavelengths, comprising:

a substrate; and an array of bolometric microplates for the detection of said radiation, suspended above the substrate by means of support elements.

According to the invention:

the detector comprises a membrane substantially transparent to the radiation to be detected, having a first refractive index, arranged above each microplate, and wherein patterns are formed, which have a second refractive index smaller than the first refractive index, across at least a portion of the thickness of the membrane;

the patterns of the membrane are placed periodically therein, along at least one predetermined axis, according to a period shorter than or equal to $$\frac{\lambda}{n},$$

where $\lambda$ is a wavelength from the wavelength range to be detected and n is the average refractive index of the medium separating the microplate from the membrane; and the width of the patterns along to the or each predetermined axis increases from a location of the membrane, positioned above a central area of the microplate, towards the periphery of the membrane.

Further, the membrane rests on a support layer at least partially transparent to the radiation to be detected and having its thickness substantially complying with relation $$h_2 = \frac{m \times \lambda}{2 \times n_2},$$

where $h_2$ is said thickness, $n_2$ is the refractive index of the support layer, and m is a positive integer greater than or equal to 1.

In other words, the invention is the combination of several physical characteristics which induce together a focusing phenomenon, that is:

a membrane transparent to the radiation to be detected;

an alternation of materials having different refractive indexes (membrane material and material of the patterns formed in the membrane) defined by a smaller periodicity than the radiation to be detected, and which is accordingly, as far as radiation is concerned, an effective refractive index which is piecewise homogeneous; and an effective refractive index gradient in the membrane plane, the effective refractive index decreasing as it is drawn away from the "center" of the membrane (or any other location considered as such regarding the microplate), due to the increase in the pattern size. For example, considering a constant pattern size increase, a hyperbolic effective index profile is obtained in the membrane plane along each periodicity axis.

Thus, for a planar wave front incident on the membrane, the light crossing it is more and more slowed down as it is drawn closer to the membrane center since the effective refractive index increases towards the center. The wave front at the membrane output thus has a convex curve. The membrane according to the invention thus behaves similarly to a conventional converging lens for the radiation to be detected. The radiation incident on the membrane is thus concentrated on the microplate. Particularly, since the membrane extends beyond the microplate, part of the radiation incident on the membrane portion which is not in line with the microplate is "redirected" towards it. The useful surface area dedicated to the radiation detection is thus increased, and, as a consequence, the general sensitivity of the detector is optimized. Further, this effect is obtained without for the ratio between the surface area of the microplates and the total surface area of the array of the microplates to be substantially modified.

In the following description, and as usually admitted in the field, term pixel, when it refers to the detection array, should be understood as all the hardware elements generating an output signal relative to an image point, as well as to the surface area dedicated to these elements.

Further, the support layer particularly enables to reinforce the membrane. By selecting its thickness according to the above relation, the support layer is optically neutral, the radiation at the membrane output substantially behaving as if the support layer did not exist.

The support layer is a thin layer formed by means of deposition, photolithography, or etching techniques. The support layer has a thin thickness, preferably smaller than 10 micrometers.

According to an embodiment of the invention, the pattern period is substantially equal to $$\frac{\lambda}{4 \times n}.$$

This value is a good compromise between the sub-wavelength property of the step of the membrane patterns, which enables to define a homogeneous effective refractive index for the radiation, and the pattern manufacturing simplicity.

More particularly, the width of the patterns at said location of the membrane verifies relation $$\frac{W_0}{P} \leq 0.5,$$

where $W_0$ is the width at said location and P the period along the predetermined axis. This value provides patterns of small width at their center, and of greater width towards the outside, while taking into account technological constraints which generally limit the dimension of the patterns which may be obtained.

Preferably, the interval between the widths of two adjacent patterns is smaller than or equal to $$\frac{\lambda}{10 \times n}.$$

Thereby, the variation of the refractive index is regular as concerns the radiation to be detected.

According to an embodiment of the invention, the thickness of the patterns is greater than or equal to $$\frac{\lambda}{10 \times n}.$$

The phase-shift difference of the radiation at the output of the membrane between the center and the edge thereof particularly depends on the membrane thickness, since maximum phase shift $\Delta\varphi_{max}$ complies with relation $$\Delta\varphi_{max} = \frac{2\pi}{\lambda}(n_h - n_b) \times h_1,$$

where $n_h$ and $n_b$ respectively are the refractive indexes of the membrane and of the patterns, and $h_1$ is the pattern thickness. By selecting a thickness $h_1$ greater than or equal to $$\frac{\lambda}{10 \times n},$$

a significant phase shift allowing a high focusing is thus obtained.

According to an embodiment, m is equal to 1.

According to a variation of the invention, the membrane patterns are also formed in the support layer, at least across a portion of the thickness thereof.

Advantageously, the support layer forms, with lateral support walls, a tight enclosure having an assembly of at least one microplate comprising the microplate arranged therein.

According to an embodiment, the patterns tightly fill openings formed in the membrane, and the membrane forms, with lateral support walls, a tight enclosure having an assembly of at least one microplate comprising the microplate arranged therein. The membrane thus belongs to a micropackaging while also performing its focusing function.

Particularly, the tight enclosure is an individual enclosure comprising a single microplate.

According to an embodiment, the patterns are openings formed in the membrane and filled with a gas, particularly air, which enables to provide a strong index contrast between the membrane materials and patterns, since the refractive index of a gas is generally close to one. A high focusing is thus obtained.

According to an embodiment of the invention, the membrane is supported by a structure bearing at least on a portion of the microplate support elements, which decreases the bulk of the membrane support structure.

According to an embodiment, the membrane patterns are parallel strips, so that the texturing detection is sensitive to a single polarization.

As a variation, there exist several axes having a decreasing effective index gradient therealong from the center to the edge of the membrane. Particularly, the membrane patterns are square or circular. Thereby, the texturing detection is insensitive to the polarization of the incident radiation.

According to an embodiment, the membrane is made of germanium, silicon, or of an alloy thereof These materials are indeed transparent in the infrared wavelength range.

As a variation, the membrane is made of silicon oxide SiOx, of SiON, or of SiN, or of an alloy thereof These materials are indeed transparent in the terahertz range.

The invention also aims at a method of manufacturing a bolometric detector of the above-mentioned type, comprising forming an array of bolometric microplates suspended above a substrate by means of support elements, the forming of the microplate array comprising depositing a first sacrificial layer on the substrate and depositing the microplates on the first sacrificial layer.

According to the invention, the method comprises:
depositing, on the first sacrificial layer and the bolometric membranes, a second sacrificial layer;
depositing, on the second sacrificial layer, a support layer at least partially transparent to the radiation to be detected and having its thickness substantially complying with relation $$h_2 = \frac{m \times \lambda}{2 \times n_2},$$

where $h_2$ is said thickness, $n_2$ is the refractive index of the support layer, and m is a positive integer greater than or equal to 1;
depositing, on the support layer and above each microplate, a layer substantially transparent to the radiation to be detected having a first refractive index;
forming across at least a portion of the thickness of each layer arranged above a microplate, patterns having a second refractive index smaller than the first refractive index, the patterns being periodically placed therein, along at least one predetermined axis, according to a period smaller than or equal to $$\frac{\lambda}{n},$$

where $\lambda$ is a wavelength from the wavelength range to be detected and n is the average refractive index of a medium separating the microplate from the layer once the first and second sacrificial layers have been removed, and the pattern width along the or each predetermined axis increasing from a location of the layer, positioned above a central area of the microplate, towards the periphery of the layer; and
removing the first and second sacrificial layers.

According to an embodiment, the forming of the patterns comprises etching the layer across its entire thickness, and the support layer and the etching are selected to obtain a selective etching of the layer.

Thus, the support layer forms a stop layer on forming of the patterns by etching of the membrane layer.

Particularly, the deposition of the support layer comprises depositing a first layer of an oxidizable material and a step of oxidizing the free surface of the support layer to obtain an oxide layer.

BRIEF DESCRIPTION OF THE DRAWINGS

The invention will be better understood on reading of the following description provided as an example only in relation with the accompanying drawings, where the same reference numerals designate the same or similar elements, among which:

FIGS. 23 and 24 respectively are top views of an array of microplates with individual supporting elements and of an array of microplates with common supporting elements;

DETAILED DESCRIPTION OF THE INVENTION

Figure 1:
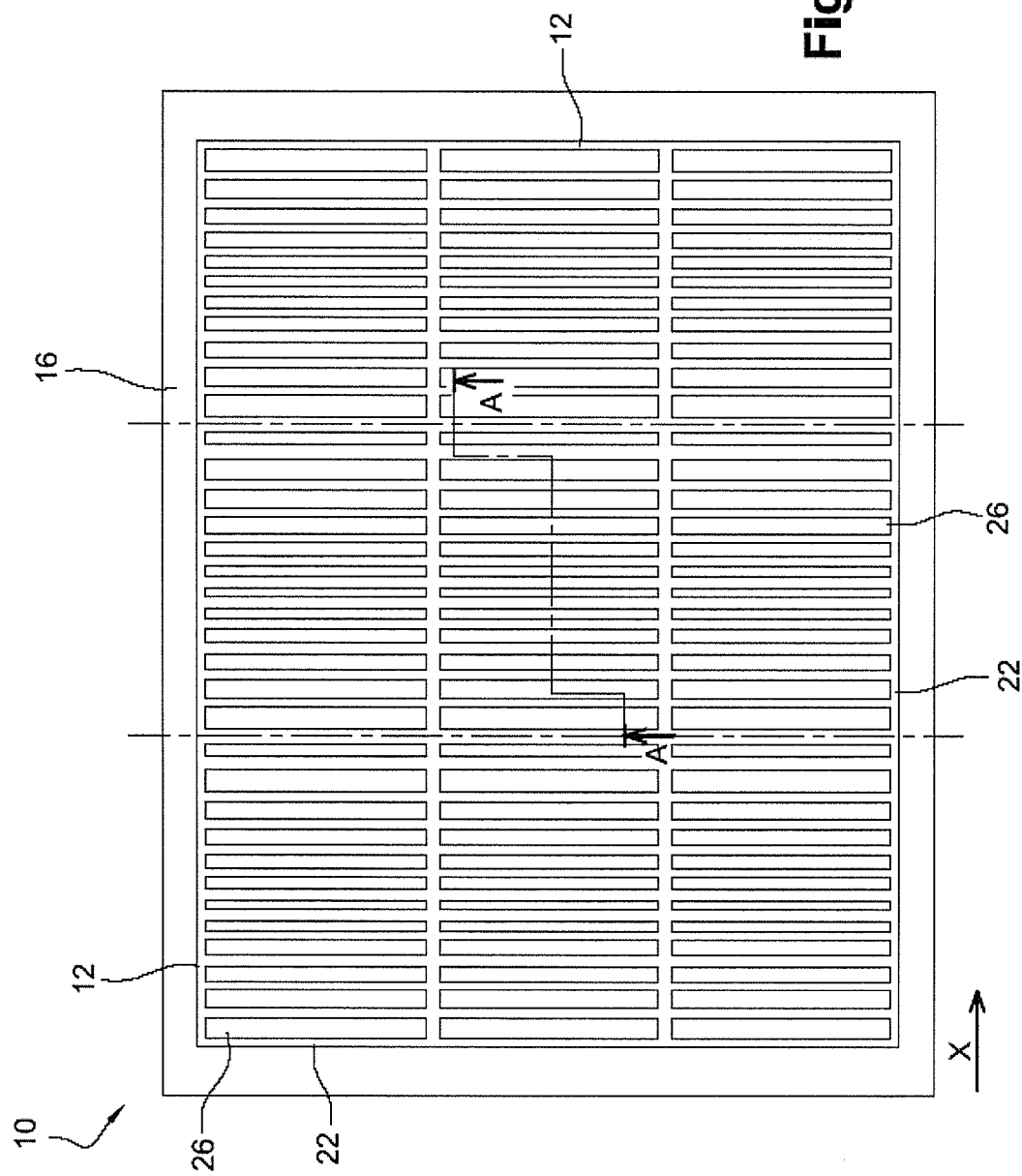
FIG. 1 is a simplified top view of an array of three bolometric pixels by three bolometric pixels provided with focusing membranes according to a first embodiment of the invention.
Figure 2:
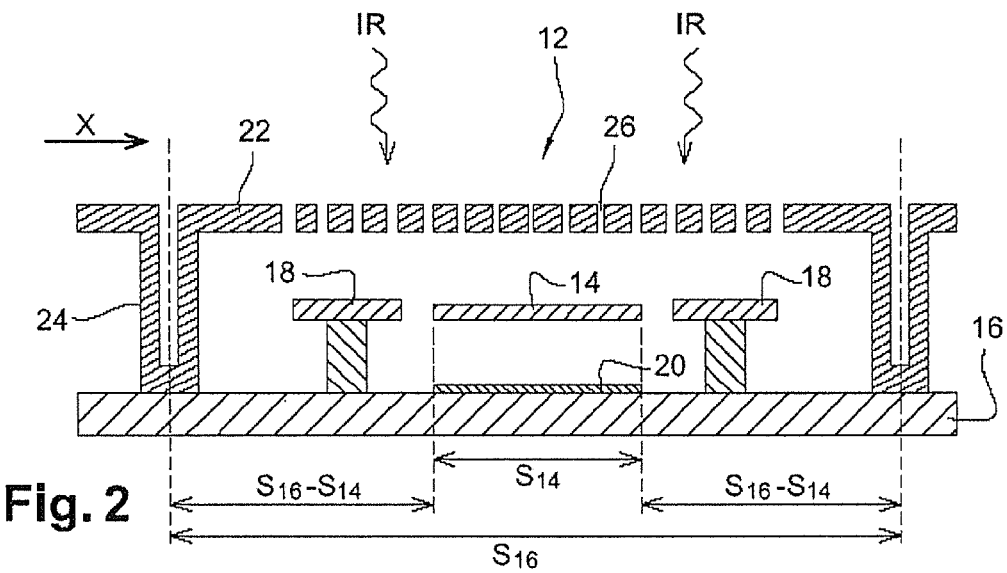
FIG. 2 is a simplified cross-section view of the array of FIG. 1 along section A-A.

Referring to FIGS. 1 and 2, a bolometric detection array 10 of three pixels by three pixels according to a first embodiment of the invention is illustrated as an example.

Each pixel 12 comprises a bolometric microplate 14, suspended above a substrate 16 by support and thermal insulation elements 18, and enabling to detect an incident electromagnetic radiation "IR" in an infrared wavelength range from 0.75 micrometer to 100 micrometers and/or in a terahertz wavelength range from 100 micrometers to 3 millimeters.

As known per se, microplate 14 heats up under the action of incident radiation IR and sees its electric resistance vary according to its heating. A same material may be used to implement these two functions, such as silicon, for example, which is adapted to the detection of wavelengths in medium infrared.

Support and thermal insulation elements 18 are mainly formed of a material which is a poor heat conductor, enabling to submit microplate 14 to a bias voltage and/or current for the measurement of its electric resistance. Support elements 18 are electrically connected to a read circuit arranged in substrate 16 which drives the polarization of microplate 14.

Each pixel 12 further comprises a planar reflector 20 formed from a metal layer deposited on substrate 16, and arranged under microplate 14. Reflector 20 has the function of reflecting the portion of the radiation having crossed microplate 14 without being absorbed, thus allowing at least a double passing of the radiation in the microplate, or even a resonance phenomenon when the distance between microplate 14 and reflector 20 is adjusted for example to form a quarter-wave plate.

In the context of the invention, the structure and the operation of bolometric microplates 14 matter little, and any type of microplate may be envisaged, such as for example that described in document FR 2 752 299. It should only be noted that the invention applies to any bolometric array, where the surface area of the microplates is decreased as compared with the pixel surface area.

Advantageously, each pixel 12 also comprises a focusing membrane 22 transparent to the radiation to be detected, suspended above microplate 14 by a support structure 24 which is formed on substrate 16 substantially at mid-distance between pixel 12 and the pixels adjacent thereto. Focusing membrane 22 is for example made of germanium, silicon, or an alloy thereof, these materials being transparent to infrared radiation, and thus adapted to an infrared detection, or made of SiOx, SiON, or SiN, such materials being transparent to terahertz radiation, and thus adapted to a terahertz detection.

In the illustrated example, microplate 14 and membrane 22 are rectangular and centered on each other.

Support structure 24, for example, in the form of lateral walls, surrounds microplate 14, the support elements, as well as surface $S_{16}$ of substrate 16 dedicated to pixel 12, so that membrane 22 substantially covers the entire surface area of pixel 12. Particularly, membrane 22 substantially covers the most part of, or all of surface $S_{16}$-$S_{14}$ of pixel 12 which is not covered by microplate 14.

Membrane 22 further comprises an assembly of parallel rectilinear slots membrane having a rectangular cross-section, formed across the entire width of membrane 22, slots 26 being arranged to focus on microplate 14 a radiation IR incident on membrane 22, and particularly the radiation incident on membrane portion 22 which is not arranged above microplate 14.

As known per se, microplate 14 is thermally insulated from its environment and is for this purpose suspended in a gas, for example, air or a neutral gas, most often under a decreased pressure. Membrane 22 is thus also suspended in this gas, and since a gas has a refractive index close to one, slots 26 define in membrane 22 patterns having a refractive index smaller than the refractive index of the material forming membrane 22.

Figure 3:
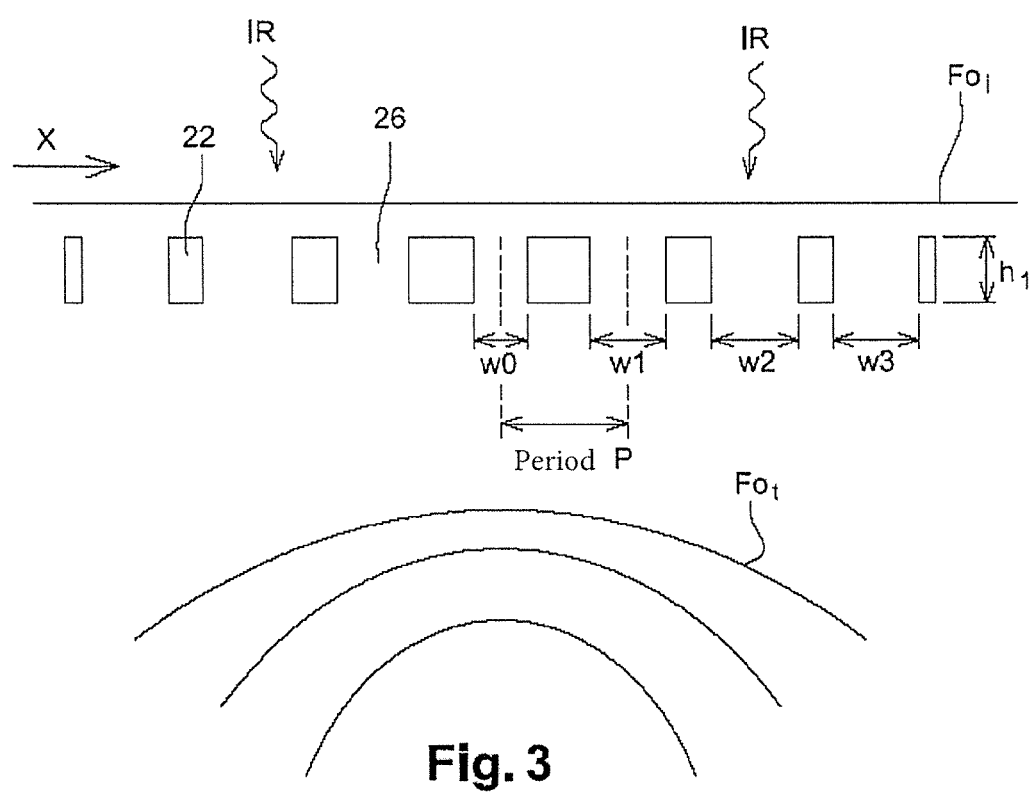
FIG. 3 is a simplified cross-section view of a membrane according to the invention of FIG. 1.

Referring to FIG. 3, slots 26 are regularly placed along direction X perpendicular thereto, the median axes of slots 26 being positioned according to a constant period P. This period, selected according to a wavelength λ to be focused on microplate 14, is shorter than $$\frac{\lambda}{n},$$

where n is the refractive index of the medium separating microplate 14 from membrane 22. Period P is preferably substantially equal to $$\frac{\lambda}{4 \times n},$$

this value being an advantageous compromise between, on the one hand, the fact that period P should be shorter than wavelength λ/n and, on the other hand, an easy slot manufacturing, the manufacturing being usually more and more difficult as the period decreases.

Further, width W of slots 26 along direction X increases from the center of membrane 22, that is, in the illustrated example, from the location of membrane 22 in line with the center of microplate 14, towards the periphery of membrane 22, to focus the incident radiation on membrane 22 in a central space under membrane 22, which enables to increase the quantity of radiation "seen" by microplate 14 and thus absorbed by it.

Advantageously, difference ($W_{n+1}-W_n$) between widths $W_n$ and $W_{n+1}$ of two adjacent slots is smaller than or equal to $$\frac{\lambda}{10 \times n}.$$

Thereby, the variation of the effective refractive index is regular as concerns the radiation to be detected.

Advantageously, the width increase as it is drawn away from the center of membrane 22 is constant, the slot width thus increasing linearly. It is however possible to provide a non-linear increase of the slot width.

Advantageously still, width $W_0$ of the slot complies with relation $$\frac{W_0}{P} \le 0.5,$$

and is preferably substantially equal to $$\frac{P}{2}.$$

It should be noted that condition $$\frac{W_0}{P}$$

is substantially equal to P/2, which enables to ease the slot manufacturing by avoiding slots which are too thin to be manufactured. It should however be noted that it is possible to provide much smaller values of $$\frac{W_0}{P}.$$

For a period P equal to $$\frac{\lambda}{4 \times n},$$

width $W_0$ is thus smaller than $$\frac{\lambda}{8 \times n},$$

that is, very small as compared with the radiation to be detected. The width of slots 26, although increasing from the center to the periphery of membrane 22, thus remains small as compared with the wavelength, given the value of width increment ($W_{n+1}-W_n$).

Advantageously still, thickness $h_1$ of membrane 22, and thus the thickness of the patterns formed by slots 26, is greater than or equal to $$\frac{\lambda}{10 \times n}.$$

Due to the increase of slots 26 from the center to the periphery of membrane 22, there thus is an effective refractive index gradient in the plane thereof, along the periodicity direction.

Figure 4:
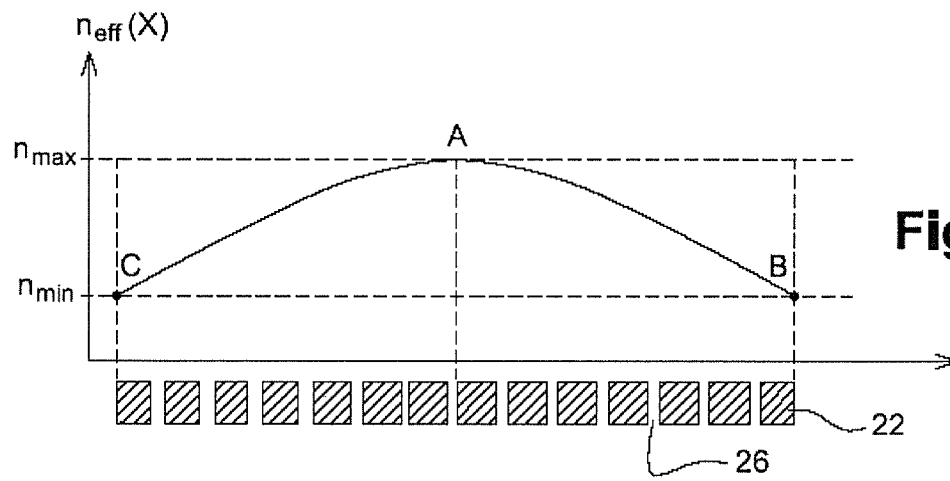
FIG. 4 is a profile of the effective refractive index of the membrane of FIG. 1 along a periodicity axis of the patterns thereof.

Such a gradient is illustrated in FIG. 4 which is a plot of the effective refractive index according to an axis of abscissas along direction X. Effective index $n_{eff}$ is calculated by calculating an average of refractive index $n_h$ of the material forming membrane 22 and of refractive index $n_b$ of the material or medium filling slots 26, the indexes being weighted by the fill factor of the involved materials, that is, an effective index according to relation $n_{eff}=\sqrt{f_b \cdot (n_b^2)+(1-f_b)\cdot(n_h^2)}$, where $f_b$ is the local proportion of material or medium of low index $n_b$, that is, in the embodiment, local width $w_i$ of slots 26 divided by period P.

The effective refractive index is thus maximum ($n_{max}$) at the center of membrane 22 and is smaller than or equal to refractive index $n_h$ of the material forming membrane 22, and decreases to reach a minimum value $n_{min}$ at the periphery thereof, this minimum value being greater than or equal to refractive index $n_b$ of the medium filling slots 26. The decrease from value $n_{max}$ to value $n_{min}$ depends on the way in which the width of slots 26 increases. In the above-described embodiment, where the increase of the width of slots 26 is constant, the effective refractive index is a hyperbole portion.

Due to the index gradient, the radiation crossing membrane 22 undergoes an increasing phase shift as it is drawn closer to the center of membrane 22. Particularly, phase shift φ(x) undergone by a planar wave front $FO_j$ incident on the membrane 22 (FIG. 3) is equal, at the first order, to $$\varphi(x) = \frac{2\pi}{\lambda} n_{eff}(x) \times h_1.$$

Wave front $FO_t$ transmitted by membrane 22 thus has a convex curve, the radiation crossing the membrane more rapidly at the periphery than at the center. The radiation is thus focused under membrane 22 and thus on microplate 14.

Preferably, the membrane is arranged at a distance preferably greater than $$\frac{\lambda}{4n}$$

away from the microplate, the intensity of the focusing being high for such distances.

Figure 5A:
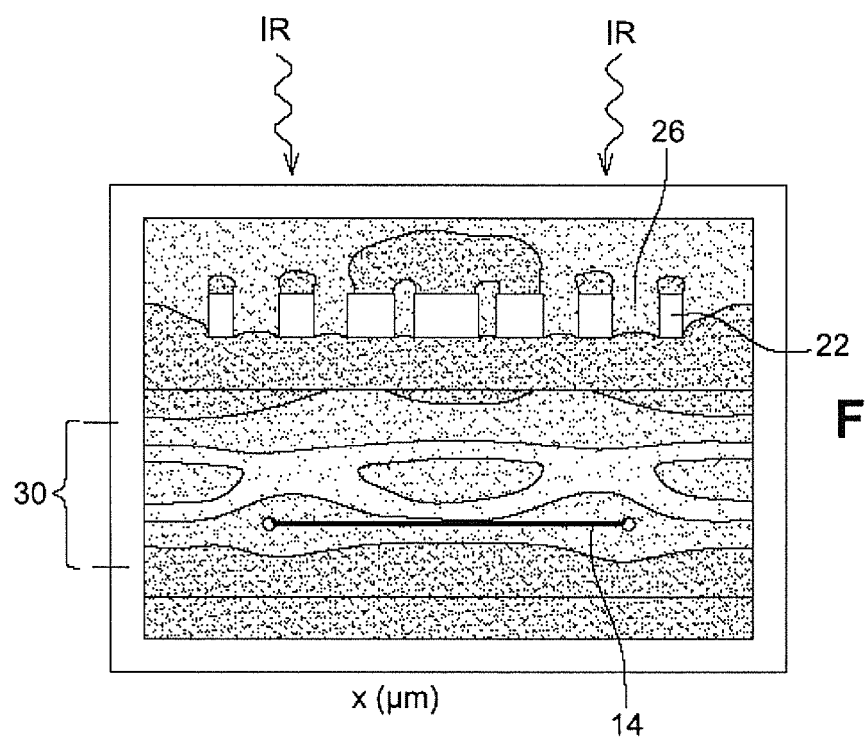
FIG. 5A is a mapping of the intensity of the electromagnetic field in the presence of a focusing membrane according to the invention in a plane normal thereto.

FIG. 5A is a mapping of the intensity of the electromagnetic field in the presence of a focusing membrane 22, and in a plane perpendicular thereto along direction X, said membrane 22 being illuminated by an infrared radiation in the 8-14

μm range. The abscissas show direction X the grey level being all the lighter as the intensity of the electromagnetic field is high, the detector parameters being defined as follows:
membrane 22 is adjusted on the 11-μm wavelength:
period P is 2.2 μm,
width $W_0$ of the central slot is equal to 0.4 μm,
the width increment ($W_{n+1}-W_n$) between two neighboring slots is equal to 400 nm, and
thickness $h_1$ of membrane 22 is equal to 1.25 μm;
thickness $h_2$ of a support layer of silicon membrane 22 is equal to 1.4 μm;
the pixel width along direction X is 17 μm, and
the width of microplate 14 along this same direction is 12 μm, microplate 14 and the membrane being centered on each other.

Membrane 22 and microplate 14 are placed in the air. Microplate 14 is here shown, as an example, at a distance l from membrane 22 equal to 5.4 μm from the bottom of membrane 22.

As it very well appears in FIG. 5A, a reinforcement of the intensity of the infrared electromagnetic field can be observed under membrane 22, and particularly a maximum reinforcement in a central area 30 under membrane 22.

Figure 5B:
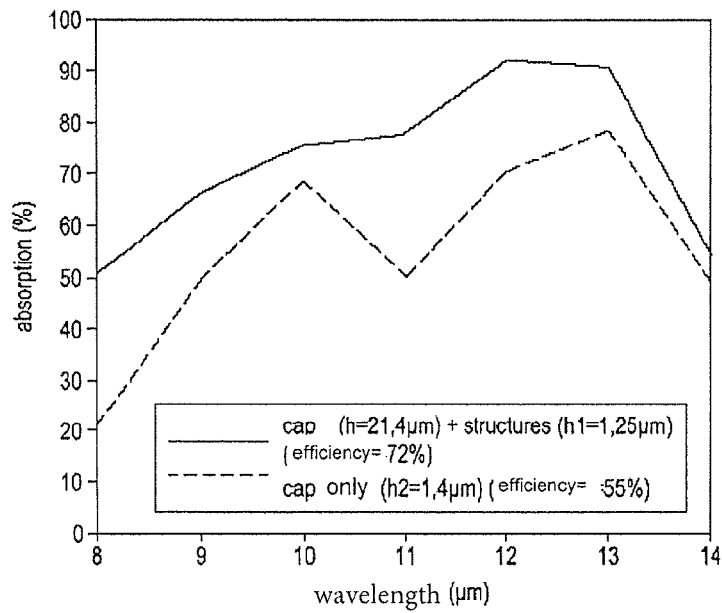
FIG. 5B is a plot of absorption curves in a TiN microplate in the presence or in the absence of the focusing membrane of the invention.

FIG. 5B is a plot of absorption curves in TiN microplate 14 in the 6-15 μm range with above-described membrane 22 (curve in full line) and without the membrane (curve in dotted line). As can be observed, a substantial reinforcement of the absorption can be observed for a wide wavelength range, this reinforcement being close to 30% of the absorption peak maximum.

An embodiment where parallel rectilinear slots are formed in membrane 22 has been described, which allows a polarization selectivity of the focusing implemented by membrane 22. However, the focused light is that which polarized perpendicularly to the slots in the plane of membrane 22.

The focusing may however be desired to be applied to several light polarizations.

Figure 6:
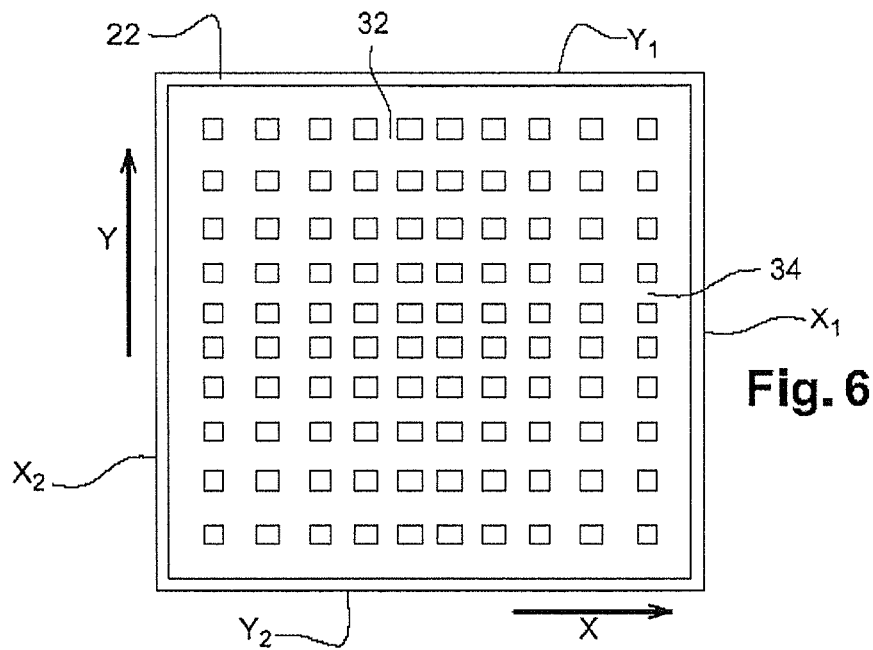
FIG. 6 is a top view of another embodiment of the focusing membrane according to the invention.

As a variation, the patterns of focusing membrane 22 are regularly arranged along several different directions in the membrane plane. As for example illustrated in FIG. 6, two networks of crossed slots 32, 34 are regularly arranged respectively along axis X and axis Y, the networks having an increment of identical width. Such an arrangement provides an identical detection of light polarizations along axes X and Y. Of course, other configurations are possible according to the targeted applications. First, the period along axis X may be different from the period along axis Y. Similarly, it is possible to provide an increment having a width along axis X which is different from that along axis Y. Similarly, it is possible to provide non-perpendicular axes X and Y, and/or slots along one or several additional axes. Also as a variation, it is possible to provide, instead of the slot networks, rectangular, square, circular, or other patterns, formed across the thickness of the focusing membrane. Here again, it is possible to define axes in the membrane plane, along which these patterns are regularly spaced apart with widths along said axes which increase as it is drawn closer to the membrane edges. Similarly, it is possible to define slots forming concentric closed contours, for example, square, rectangular, or circular contours. Some of these arrangements require for the etching of membrane 22 to be partial, or the presence of a support layer, for the mechanical hold of membrane 22.

Several embodiments of the membrane according to the invention, as well as associated manufacturing methods, particularly concerning the focusing membrane suspension structure, will now be described.

Simplified cross-section views 7 to 12 illustrate a method of manufacturing a first embodiment of the suspension structure.

Figure 7:
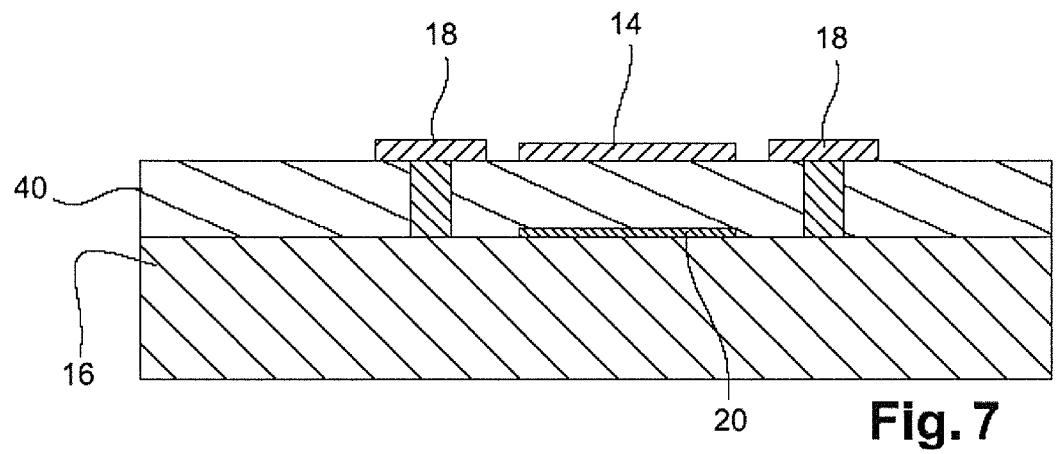
FIGS. 7 to 12 are simplified cross-section views illustrating a method of manufacturing a focusing membrane supporting structure according to a first embodiment of the invention.

The method starts with the manufacturing, on substrate 16, of microplate array 14, of support elements 18, and of reflectors 20. This manufacturing step is conventional and, as known per se, microplates 14 are formed on a sacrificial layer 40 deposited on substrate 16 (FIG. 7).

Figure 8:
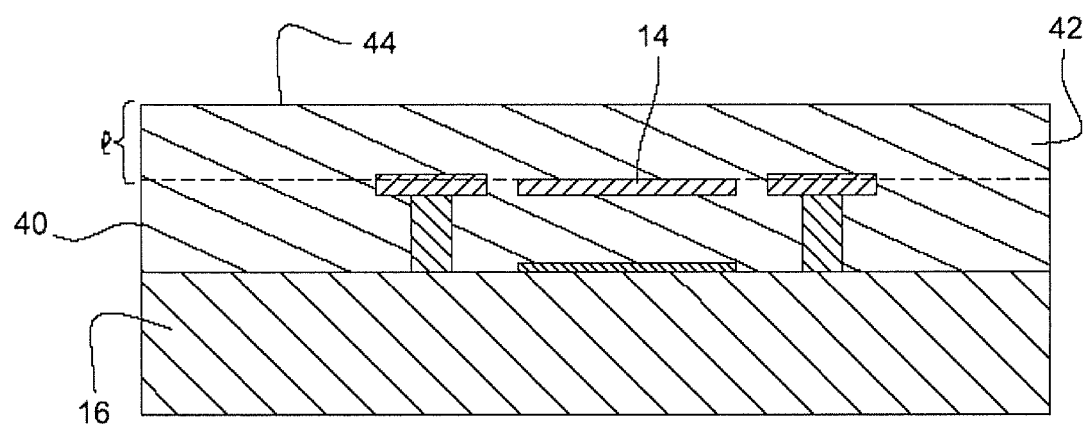

Once microplates 14 have been formed, the method carries on by depositing a second sacrificial layer 42 on first sacrificial layer 40, microplates 14, and support elements 18. The thickness of second layer 42 is equal to the desired distance l between focusing membrane 22 and microplate 14 (FIG. 8). Second layer 42 is for example deposited by means of a spin coating technique and is advantageously made of the same material as first layer 40, particularly a polyimide, a polymer, for example based on BCB (benzocyclobutene), an annealed resist or others. First and second layers 40, 42 form together a general sacrificial layer 44.

Figure 9:
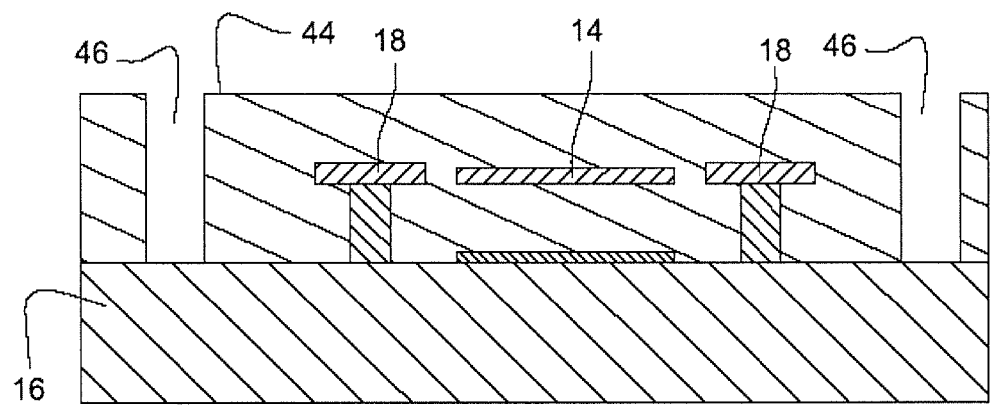

Sacrificial layer 44 is then etched all the way to substrate 16 to disengage a trench 46 all around each microplate 14 and its support elements 18 at the location desired for the support structure of the focusing membrane, for example, a trench formed at the limit of the surface of substrate 16 dedicated to microplate 14 (FIG. 9). Trenches 46 are advantageously formed by reactive ion etching (RIE), which provides a large anisotropy of the etching, or by oxygen-based etch chemistry.

Figure 10:
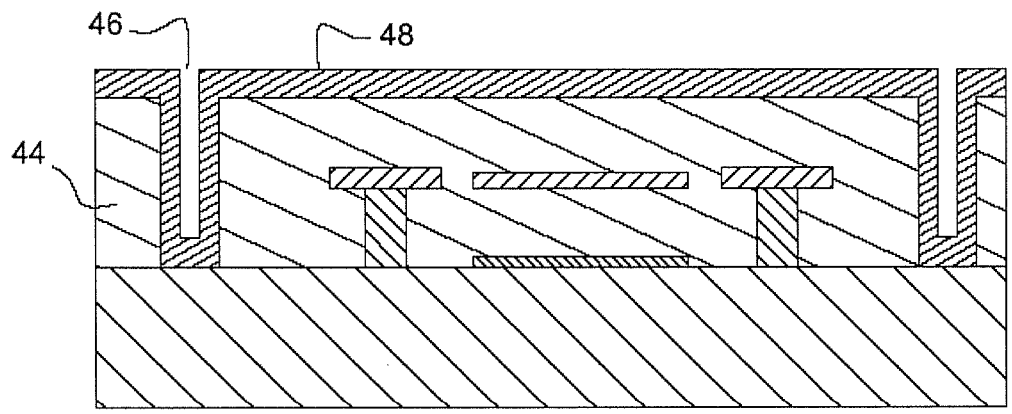

A material transparent for the radiation to be detected is then deposited full plate, so that sacrificial layer 44 and trenches 46 are covered with a layer 48 from which the focusing membrane is subsequently formed (FIG. 10). This deposition is preferably performed by means of a chemical vapor deposition (CVD), which provides a good conformality of the deposition on the sides of trenches 46. Layer 48 is for example made of germanium, silicon, or of an alloy thereof for an infrared detection, and of SiOx, SiON, or SiN for a terahertz detection.

Figure 11:
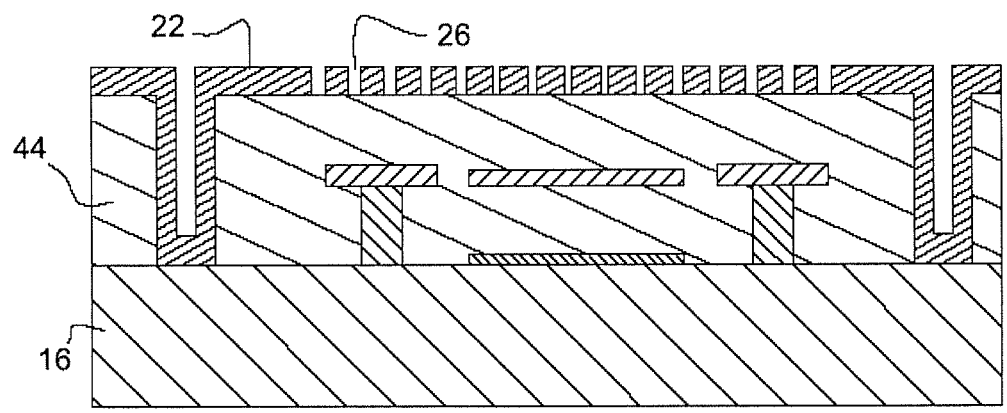

A lithography and an etching, for example, an RIE-type dry etching, are then implemented to form openings 26 in layer 48, in order to form focusing membrane 22 of the invention (FIG. 11). The lithography and the etching are here implemented in a way known per se.

Figure 12:
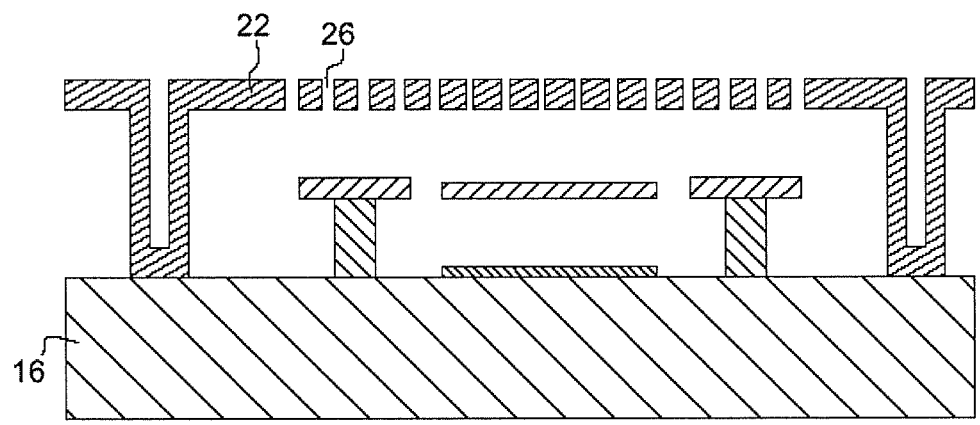

Finally, sacrificial layer 44 is removed, for example, by means of an oxygen or ozone plasma (FIG. 12).

The embodiment is advantageous since there is a minimum number of manufacturing steps.

A second embodiment of the support structure and its manufacturing method are now described in relation with the simplified cross-section views of FIGS. 13 to 19, this second embodiment enabling to jointly manufacture a focusing membrane and a tight capsule for each microplate.

Figure 13:
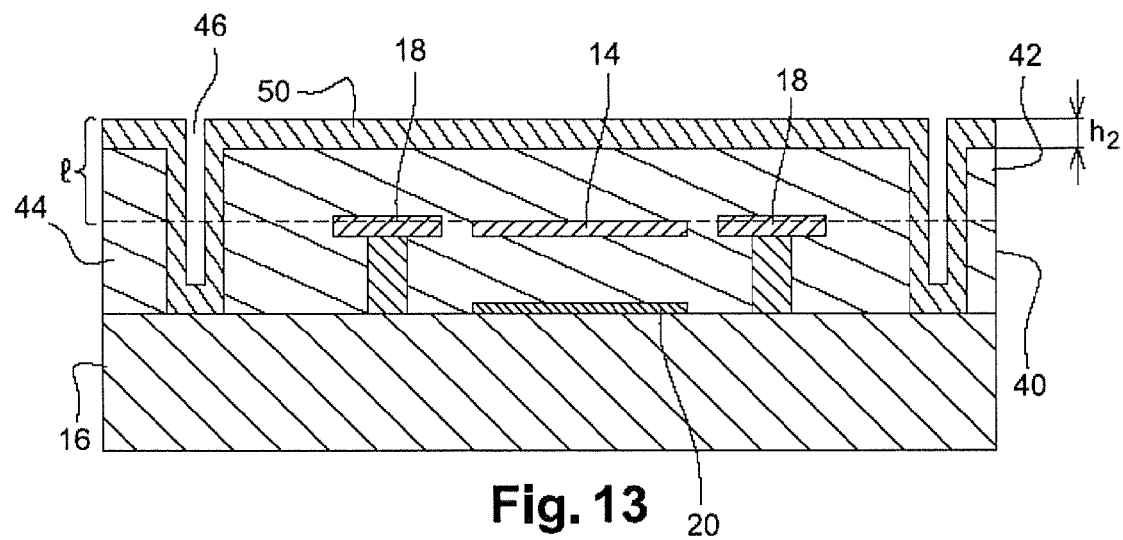
FIGS. 13 to 19 are simplified cross-section views illustrating a method of manufacturing a focusing membrane supporting structure with a tight micropackaging according to a second embodiment of the invention.

This method starts with the same steps as those described in relation with FIGS. 7 to 9, and then carries on with the full-plate deposition of a semiconductor or dielectric material, so that sacrificial layer 44 and trenches 46 are covered with a layer 50 of said material (FIG. 13). Unlike the previous embodiment, however, the thickness of second sacrificial layer 42 deposited above microplate 14 takes into account the thickness of layer 50, the sum of the thicknesses of layer 42 and of layer 50 being equal to distance l desired between focusing membrane 22 and microplate 14.

The material of layer 50 is advantageously selected to be compatible with the material of substrate 16, particularly in terms of bonding and of conformality of the deposition.

The material of layer 50 is further selected to be little absorbing in the wavelength range to be detected. For example, for the infrared wavelength range, the material of layer 50 is germanium, silicon, or Si—Ge, and for the terahertz wavelength range, the material of layer 50 is a silicon oxide SiOx, SiON, or SiN.

The thickness of layer 50, whereon membrane 22 will be subsequently formed, is advantageously selected so that layer 50 is optically neutral. To achieve this, the thickness substantially complies with relation $$h_2 = \frac{m \times \lambda}{2 \times n_2},$$

where $h_2$ is said thickness, $n_2$ is the refractive index of the support layer, and m is a positive integer greater than or equal to 1.

Figure 14:
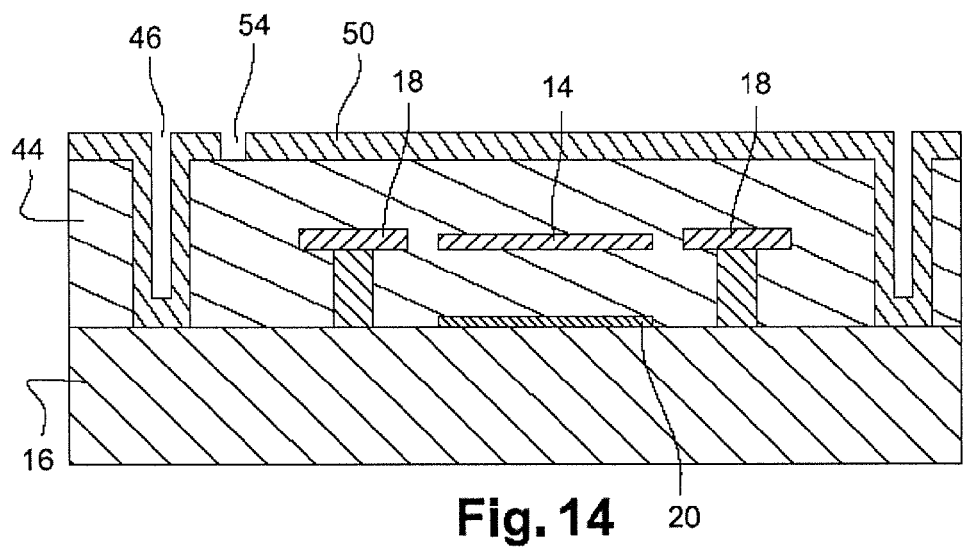
Figure 15:
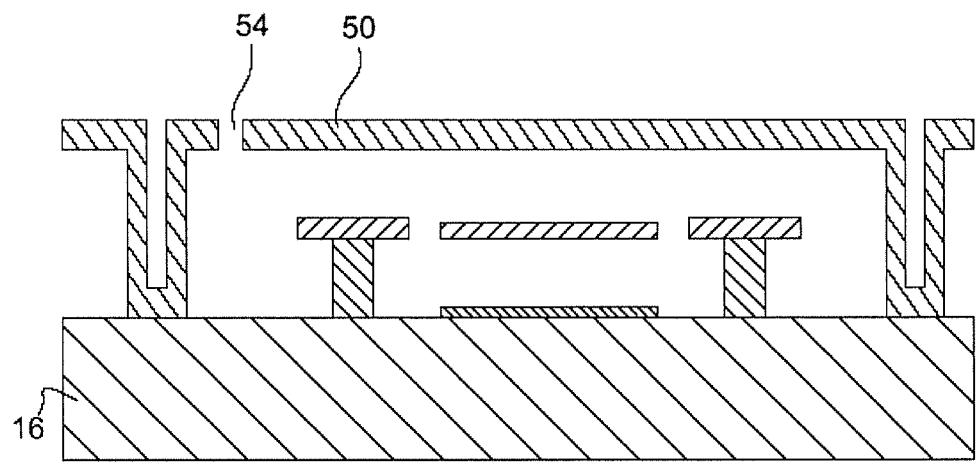

The method carries on with a lithography and an etching, for example, a dry RIE-type etching, to form a release vent 54 in layer 50 all the way to sacrificial layer 44 (FIG. 14). Sacrificial layer 44 is then removed, for example, by means of an oxygen or ozone plasma applied through release vent 54 (FIG. 15).

Figure 16:
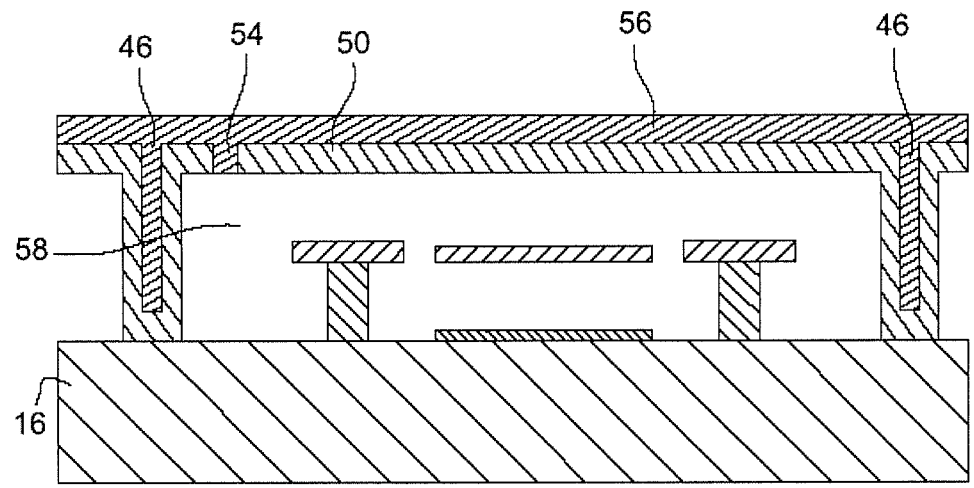
Figure 17:
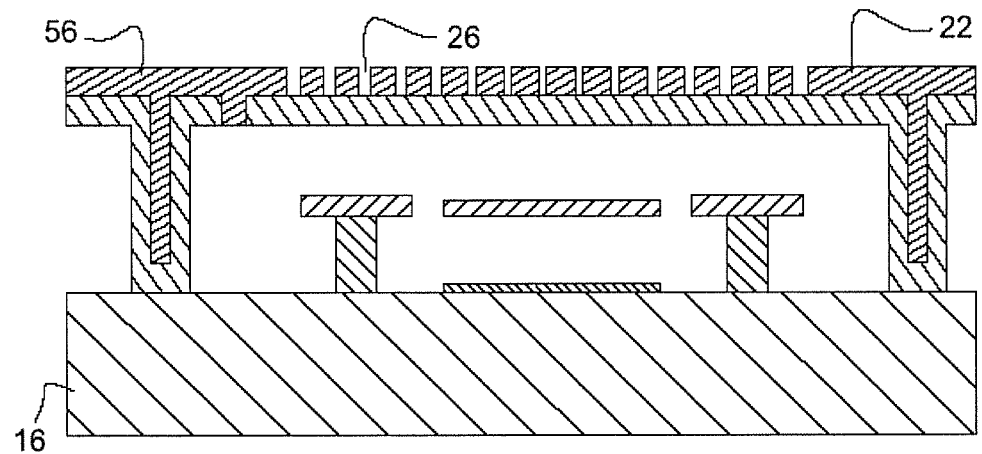
Figure 18:
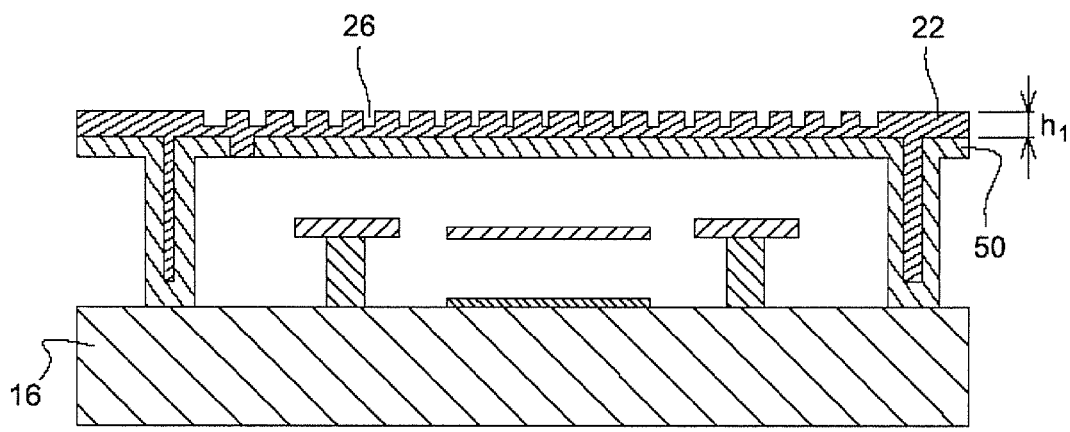

The method carries on with the full-plate deposition of the material forming the focusing membrane, for example, one of those previously described, to form a layer 56 covering layer 50, including in trenches 46 and release vent 54 (FIG. 16). A tight space 58 is thus obtained around microplate 14 and support elements 18. Layer 56 is deposited by sputtering, CVD, or evaporation to obtain a high vacuum in space 60. A tight integrated packaging is thus obtained for microplate 14.

If the thermal insulation of the detector is desired to be maximized to increase its sensitivity, deposition methods occurring at very low pressure, typically pressures lower than or equal to 1 mTorr, will preferably be used for the deposition of layer 56 to minimize the pressure in the cavity at the sealing thereof by the deposition of layer 56.

Further, if it is also desired to maximize the lifetime of vacuum and thus that of the detector, it is desirable to decrease as much as possible the number of species capable of degassing into the cavity during the detector lifetime. CVD-type deposition precursor gases typically belong to these species and, similarly, ions (typically argon) used to sputter the material of layer 56 in the case of a sputtering deposition are likely to subsequently degas into the cavity. A solution to limit the degassing thus is the use of an evaporation method to deposit layer 56.

However, vapor depositions usually have a very poor conformality, with a growth axis of the deposited layer essentially in the vertical direction. It may thus appear to be difficult or impossible (according to the size of vent 54) to tightly seal vent 54 with a vapor deposition. This is due to the fact that the evaporated atoms have a very low energy and thus travel a very short distance once they have come into contact with the surface used as a support for the deposition (here, layer 50).

A solution to however take advantage of the very good vacuum level and of the low degassing capacity provided by vapor depositions is to increase the energy of evaporated atoms once they come into contact with the deposition support (here, layer 50). This may for example be performed by heating substrate 16 during the evaporation, typically above 150° C. Layer 50 being directly in contact with substrate 16 due to trenches 46, it will thus also be heated and will give out energy to the incident evaporated atoms, thus increasing the distance traveled by said atoms at the surface of layer 50, which will enable or ease (according to the size of vent 54) the sealing of vent 54 by increasing the conformality of the deposition of layer 56.

Figure 19:
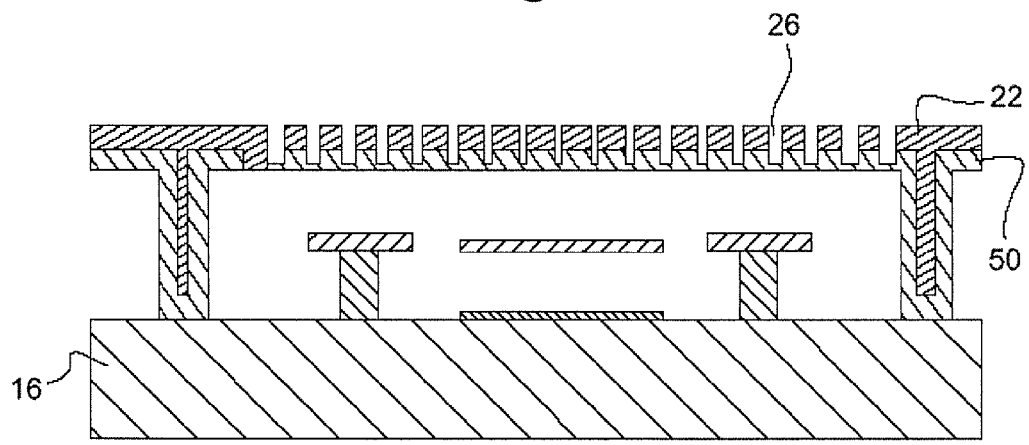

A lithography and an etching, for example, an RIE-type dry etching, are then implemented to form openings 26 in layer 56, in order to form focusing membrane 22 of the invention. The etching is performed across the entire thickness of layer 56 (FIG. 17), or partially across the thickness thereof (FIG. 18), in which case previously-described thickness $h_1$ of the patterns is the etched thickness of layer 56, or in the entire layer 56 and partially across the thickness of layer 50 (FIG. 19).

The etching of the network across the entire thickness of layer 56 (FIG. 17) enables to use a stop layer during the etch step. The presence of a stop layer provides several advantages to form focusing membrane 22. It enables to do away with possible inhomogeneities of the etch method by using an overetching. Similarly, the overetching will enable to ascertain that the etching of layer 56 is effectively complete in openings 26 even in case of a drift in the equipment used to perform the etching. The use of a stop layer thus enables to increase the control of the method of etching openings 26 and thus the output of focusing membrane 22. Further, the presence of a stop layer enables to guarantee that the depth of openings 26 is identical for all array detectors and thus ensures the homogeneity of the focusing and thus of the absorption at the array scale, which is essential for image forming.

However, the use of layer 50 as a stop layer requires using a method of etching layer 56 having a very high sensitivity for the material forming layer 50 (typically, silicon). Now, very often, this selectivity is difficult or impossible to obtain. For example, for the ease of integration, the material of layer 56 may be identical to that of layer 50 (typically, silicon), or the materials of layers 56 and 50 (typically, germanium and silicon) may have the same sensitivities to chemicals used for etching.

To be able to however use a stop layer for the etching of layer 56 (to benefit from the previously-mentioned advantages), a solution is to integrate, before the deposition of layer 56, a step of surface oxidation of layer 50. For example, a phase of temperature rise above 100° C. at the end of the release step will enable to oxidize layer 50. The surface oxide thus created is then sufficient to be used as a stop layer while remaining sufficiently thin, typically between 10 and 20 nm, to avoid disturbing the transmission of the incident wave. Typically, an RIE etch method with a flow rate of hydrogen bromide (HBr) will enable to etch the silicon or germanium forming layer 56 while stopping on the surface oxide of the silicon of layer 50.

Figure 20:
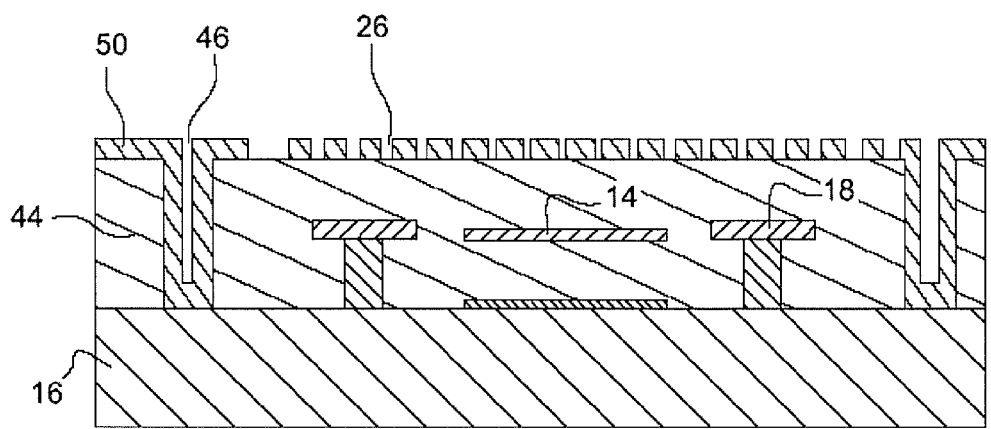
FIGS. 20 to 22 are simplified cross-section views illustrating a variation of the method of manufacturing a focusing membrane supporting structure with a tight micropackaging.
Figure 21:
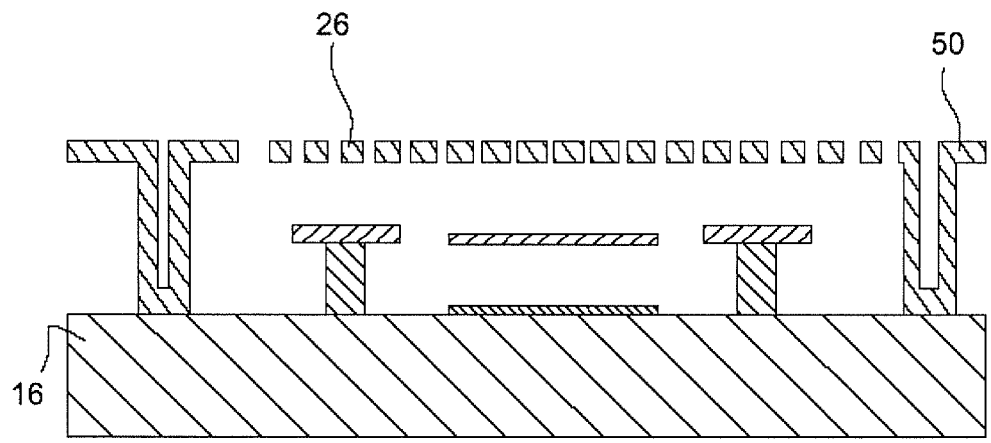
Figure 22:
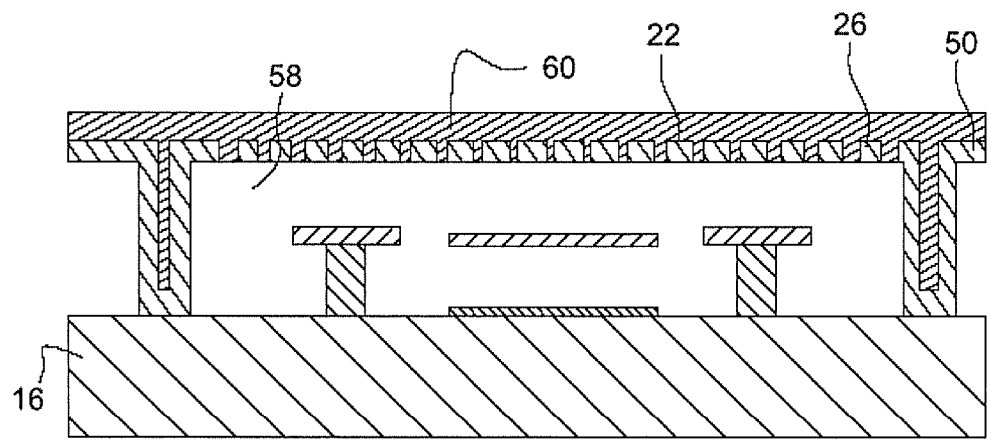

A variation of the embodiment of the support structure and its manufacturing method are now described in relation with the simplified cross-section views of FIGS. 20 to 22, this variation enabling to accelerate the removal of sacrificial layers 44 and/or to use a release method less constraining for the detector, such as for example, a method at lower temperature and/or at lower power.

The method starts with the steps previously described to obtain the structure described in relation with FIG. 13, and carries on with a lithography and an etching, for example, an RIE-type dry etching, in the entire layer 50 to define patterns 26 of low refractive index which will subsequently alternate with the material of high refractive index of the membrane (FIG. 20). Sacrificial layer 44 is then removed, for example, by means of an oxygen or ozone plasma applied through the openings made in layer 50 (FIG. 21).

The method carries on with the full-plate deposition of the material forming the focusing membrane, for example, one of those described previously, to form a layer 60 covering layer 50 and filling the openings between patterns 26, including in trenches 46 (FIG. 22). The deposition of layer 60 is performed by sputtering, CVD, or evaporation to obtain a high vacuum in space 58. An integrated tight packaging is thus obtained for microplate 14.

Applications of the present invention to bolometric microplates which are suspended by individual support elements, that is, suspending a single microplate at once, have been described. A top view of an example of a microplate array 14 with individual support elements 18 is shown in FIG. 23.

There however exist architectures where a support element jointly suspends two adjacent microplates, as illustrated in FIG. 24, which is a top view of an array of microplates with common support elements 18.

However, with common support elements, it is not possible to form a support structure for a focusing membrane formed of a continuous lateral wall around the microplate and its support elements, unlike the architecture with individual support elements where a free space exists all around each microplate and its support elements. It can thus easily be understood that the manufacturing of this structure in a architecture based on common support elements is complex as soon as it is desired to rest on the substrate.

A simple method of manufacturing a focusing membrane in an architecture based on common support elements will now be described in relation with the simplified cross-section views of FIGS. 25 to 30.

Figure 25:
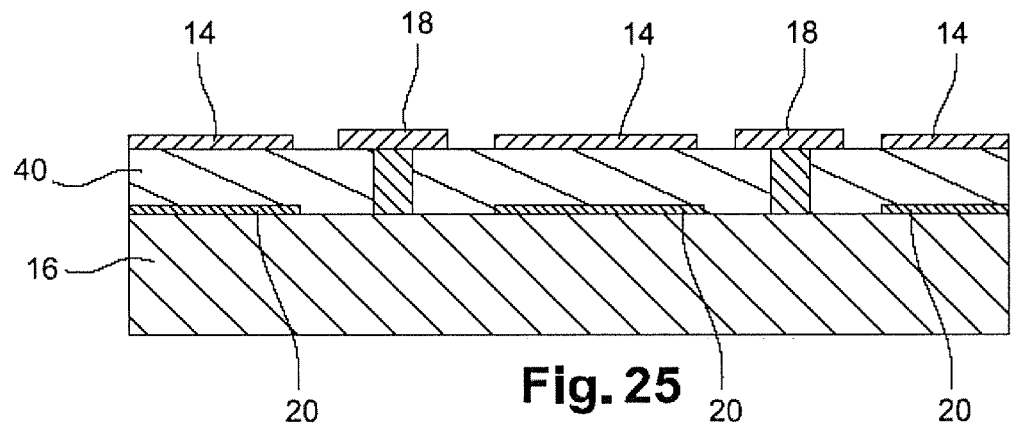
FIGS. 25 to 30 are simplified cross-section views illustrating a method of manufacturing a focusing membrane supporting structure according to a fourth embodiment of the invention.

The method starts with the manufacturing, on substrate 16, of microplate array 14, of common support elements 18, and of reflectors 20. This manufacturing step is conventional and, as known per se, microplates 14 are formed on a sacrificial layer 40 deposited on substrate 16 (FIG. 25).

Figure 26:
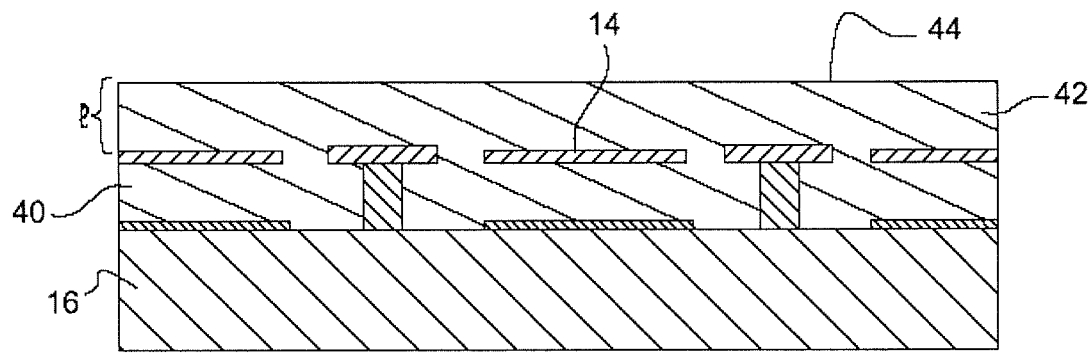

Once microplates 14 have been formed, the method carries on with the deposition of a second sacrificial layer 42 on first sacrificial layer 40, microplates 14, and common support elements 18. The thickness of second layer 42 is equal to distance l desired between focusing membrane 22 and microplate 14 (FIG. 26). Second layer 42 is for example deposited by means of a spin coating technique and is advantageously made of the same material as first layer 40, particularly a polyimide, a polymer, for example based on BCB (benzocyclobutene), an annealed resist, or others. First and second layers 40, 42 form together a general sacrificial layer 44.

Figure 27:
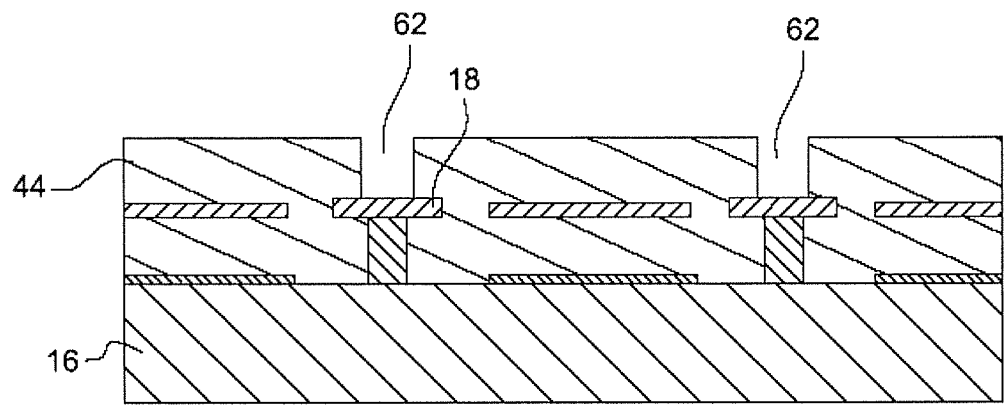

A step of etching sacrificial layer 44 is then implemented to form trenches 62 emerging on at least a portion of common support elements 18, and more exactly a portion or all of the vertical structure of elements 18 mechanically connected to substrate 16 (FIG. 27). For example, an RIE-type dry etching, which provides a high etch anisotropy, is implemented.

Figure 28:
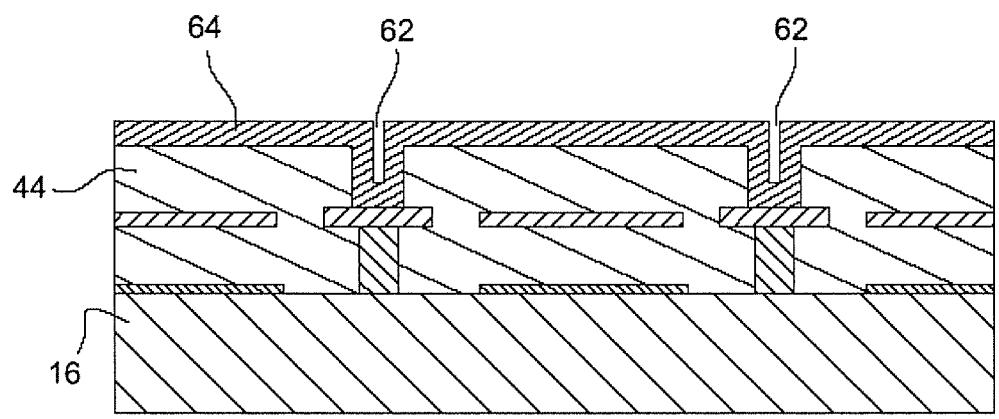

A material transparent to the radiation to be detected, for example, one of those described previously, is then deposited full plate so that sacrificial layer 44 and trenches 62 are covered with a layer 64 of this material (FIG. 28).

Figure 29:
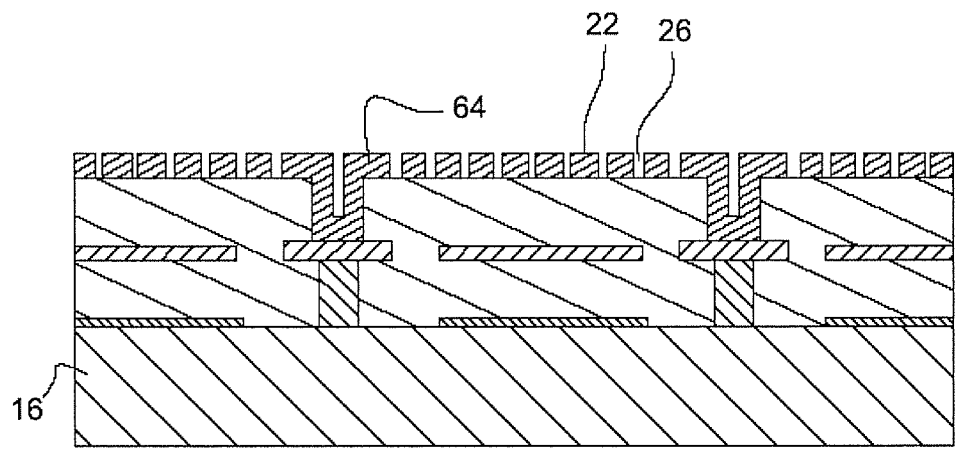
Figure 30:
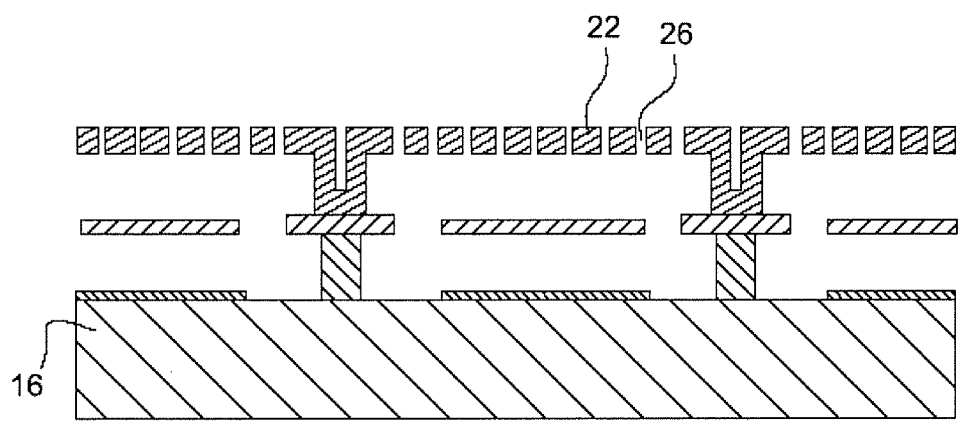

A lithography and an etching, for example, an RIE-type dry etching, are then implemented to form patterns 26 in layer 64, in order to form focusing membrane 22 of the invention (FIG. 29). Finally, sacrificial layer 44 is removed, for example, by means of an oxygen or ozone plasma (FIG. 30).

Although only the focusing membrane is formed according to the described embodiment, it is also possible to provide a dielectric and/or semiconductor layer similarly to the embodiments described in relation with the embodiments of FIGS. 13 to 19. Advantageously, the additional layer will be made of a material which is further thermally insulating to disturb as little as possible the function of thermal insulation of the common support elements. Similarly, it is possible to manufacture the focusing membrane similarly to the method described in relation with FIGS. 20 to 22.

Similarly, should the application require it, it is also possible to provide focusing membrane supporting structures which bear on individual support elements.

The invention may advantageously be used in the context of a tight integrated micropackaging: a focusing membrane, placed in the upper plane of the micropackaging, thus enables to compensate for the loss in optically-active surface area induced by the micropackaging sides. Advantage is thus taken of the production cost decrease allowed by the collective forming of the packaging while minimizing the efficiency decrease of the detector necessarily induced by this type of packaging.

Figure 31:
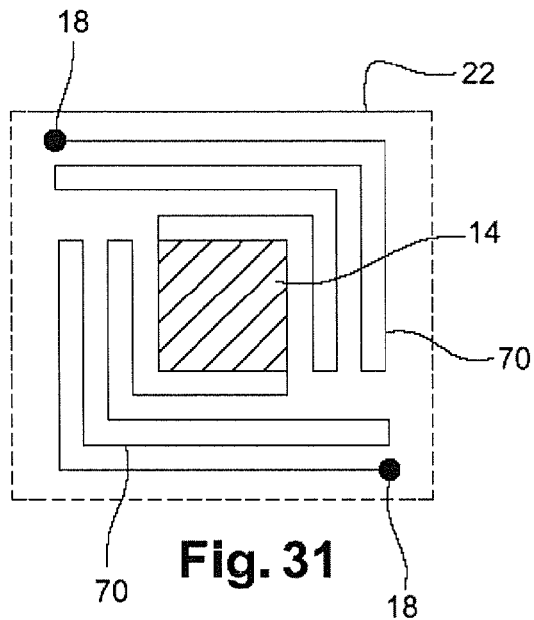
FIGS. 31 to 33 are simplified top views illustrating the use of an increase of the surface area of a pixel, respectively for a lengthening of the elements of thermal insulation of a bolometric microplate, the integration of a terahertz antenna, and the implementation of additional functions in a substrate.

The invention may also be used to increase the pixel size without increasing the surface area of the microplates, the increase of the pixel surface area being usable to improve existing functions or add new ones. For example, the surface area dedicated to the bolometric microplate thermal insulation elements may be increased, as illustrated in FIG. 31, which is a simplified top view of a microplate 14 with lengthened thermal insulation elements 70 arranged under a membrane 22 according to the invention, having its surface illustrated by the square in dotted lines.

Figure 32:
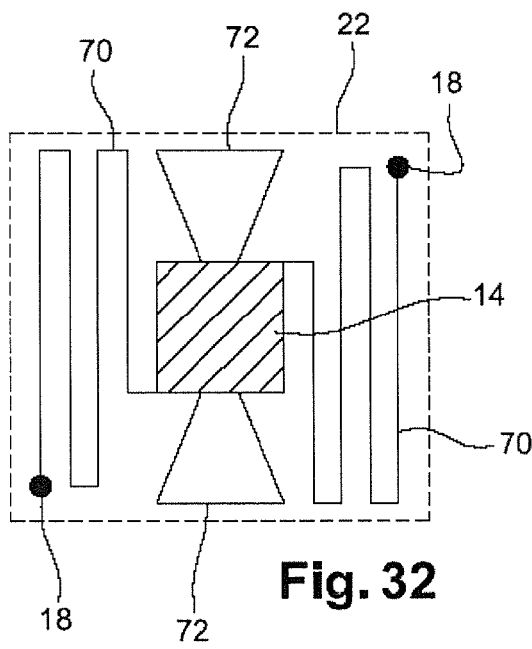

In another example, the pixel surface area increase may be used to provide a second detection element, as illustrated in the simplified top view of FIG. 32, where a terahertz antenna 72 is specifically provided for the detection of the terahertz radiation.

Figure 33:
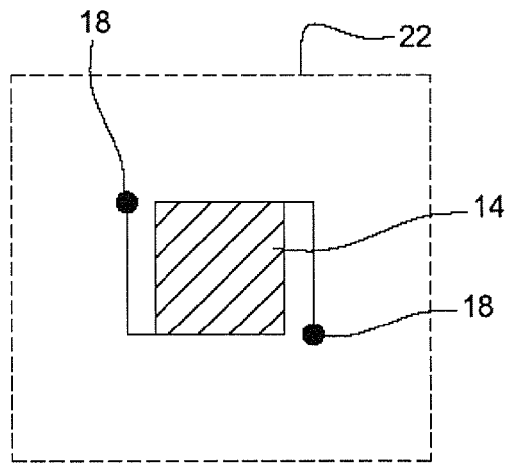

In another example, illustrated in FIG. 33, the surface area increase per pixel is used to implement additional functions, for example, a digital conversion of the pixel signal, or a sensor visible at the CMOS level, in the substrate having the bolometric microplates suspended thereabove.

The invention claimed is:

1. An array bolometric detector for the detection of an electromagnetic radiation in a predetermined range of infrared or terahertz wavelengths, comprising:
   a substrate; and
   an array of bolometric microplates for the detection of said radiation, suspended above the substrate by support elements,
   wherein said detector comprises:
      a support layer at least partially transparent to the radiation to be detected and having a thickness substantially complying with relation $$h_2 = \frac{m \times \lambda}{2 \times n_2},$$

where $h_2$ is said thickness, $n_2$ is the refractive index of the support layer, and m is a positive integer greater than or equal to 1;
      a membrane substantially transparent to the radiation to be detected and resting on the support layer, having a first refractive index, arranged above each microplate, and wherein patterns are formed, which have a second refractive index smaller than the first refractive index, across at least a portion of the thickness of the membrane;
   and wherein:
      the patterns of the membrane are placed periodically therein, along at least one predetermined axis, according to a period shorter than or equal to $\lambda/n$, where $\lambda$ is a wavelength from the wavelength range to be detected and n is the average refractive index of the medium separating the microplate from the membrane;

the width of the patterns along each predetermined axis increases from a location of the membrane, positioned above a central area of the microplate, towards the periphery of the membrane.

2. The array bolometric detector of claim 1, wherein said period is substantially equal to $$\frac{\lambda}{4 \times n}.$$

3. The array bolometric detector of claim 1, wherein the width of the patterns at said location of the membrane complies with relation $$\frac{W_0}{P} \leq 0.5,$$

where $W_0$ is the width of the patterns at said location and P is the period along the predetermined axis.

4. The bolometric detector of claim 1, wherein difference ($W_{n+1} - W_n$) of widths $W_n$ and $W_{+1}$ between two adjacent patterns is smaller than or equal to $$\frac{\lambda}{10 \times n}.$$

5. The array bolometric detector of claim 1, wherein the thickness of the patterns is greater than or equal to $$\frac{\lambda}{10 \times n}.$$

6. The array bolometric detector of claim 1, wherein the patterns tightly fill openings formed in the membrane, and wherein the membrane forms, with lateral support walls, a tight enclosure having an assembly of at least one microplate comprising the microplate arranged therein.

7. The array bolometric of claim 1, wherein the membrane is supported by a structure bearing on at least a portion of the support elements of the microplate.

8. The array bolometric detector of claim 1, wherein the patterns of the membrane are parallel strips.

9. The array bolometric detector of claim 1, wherein the patterns of the membrane are square or circular.

10. The array bolometric detector of claim 1, wherein the membrane is made of germanium, of silicon, or of an alloy thereof.

11. The array bolometric detector of claim 1, wherein the membrane is made of SiOx, of SiON, of SiN, or of an alloy thereof.

12. The array bolometric detector of claim 1, wherein the patterns are formed by openings made in the membrane and filled with a gas.

13. The array bolometric detector of claim 12, wherein the gas is air.

14. A method of manufacturing the bolometric detector of claim 1, comprising forming an array of bolometric microplates suspended above a substrate by support elements, the forming of the microplate array comprising depositing a first sacrificial layer on the substrate and depositing the microplates on the first sacrificial layer, wherein said method comprises:

depositing, on the first sacrificial layer and the bolometric membranes a second sacrificial layer;

depositing, on the second sacrificial layer, a support layer at least partially transparent to the radiation to be detected and having its thickness substantially complying with relation $$h_2 = \frac{m \times \lambda}{2 \times n_2},$$

where $h_2$ is said thickness, $n_2$ is the refractive index of the support layer, and in is a positive integer greater than or equal to 1;

depositing, on the support layer and above each microplate, a layer substantially transparent to the radiation to be detected having a first refractive index;

forming across at least a portion of the thickness of each layer arranged above a microplate, patterns having a second refractive index smaller than the first refractive index, the patterns being periodically placed therein, along at least one predetermined axis, according to a period smaller than or equal to $$\frac{\lambda}{n},$$

where $\lambda$ is a wavelength from the wavelength range to be detected and n is the average refractive index of a medium separating the microplate from the layer once the first and second sacrificial layers have been removed, and the width of the pattern along the or each predetermined axis increasing from a location of the layer, positioned above a central area of the microplate, towards the periphery of the layer; and removing the first and second sacrificial layers.

15. The method of claim 14, wherein the forming of the patterns comprises etching the layer across the entire thickness thereof, and wherein the support layer and the etching are selected to obtain a selective etching of the layer.

16. The method of claim 15, wherein the deposition of the support layer comprises depositing a first layer of an oxidizable material and a step of oxidizing the free surface of the support layer to obtain an oxide layer.

17. The array bolometric detector of claim 1, wherein in is equal to 1.

18. The array bolometric detector of claim 17, wherein the patterns of the membrane are also formed in the support layer at least across a portion of the thickness thereof.

19. The array bolometric detector of claim 17, wherein the support layer forms, with lateral support walls, a tight enclosure having an assembly of at least one microplate comprising the microplate arranged therein.

20. The array bolometric detector of claim 19, wherein the tight enclosure is an individual enclosure comprising a single microplate.

* * * * *